(12) United States Patent
Kaneda

(10) Patent No.: US 11,018,661 B2
(45) Date of Patent: May 25, 2021

(54) SHORT CIRCUIT DETECTOR INCLUDING A VOLTAGE DETECTOR

(71) Applicant: FUJI ELECTRIC CO., LTD., Kanagawa (JP)

(72) Inventor: Hirotoshi Kaneda, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 326 days.

(21) Appl. No.: 15/960,570

(22) Filed: Apr. 24, 2018

(65) Prior Publication Data
US 2018/0331678 A1 Nov. 15, 2018

(30) Foreign Application Priority Data
May 11, 2017 (JP) .............................. JP2017-094632

(51) Int. Cl.
| | |
|---|---|
| *G01R 31/28* | (2006.01) |
| *H03K 17/082* | (2006.01) |
| *G01R 31/50* | (2020.01) |
| *H02H 1/00* | (2006.01) |
| *H02H 3/16* | (2006.01) |

(52) U.S. Cl.
CPC ....... *H03K 17/0822* (2013.01); *G01R 31/281* (2013.01); *G01R 31/50* (2020.01); *H02H 1/0007* (2013.01); *H02H 3/16* (2013.01)

(58) Field of Classification Search
None
See application file for complete search history.

(56) References Cited

U.S. PATENT DOCUMENTS

| | | | | |
|---|---|---|---|---|
| 5,864,211 A | * | 1/1999 | Kiermeier | ............ H02H 7/1227 |
| | | | | 315/127 |
| 6,680,837 B1 | * | 1/2004 | Buxton | .................. H02H 3/087 |
| | | | | 327/309 |
| 2005/0146823 A1 | | 7/2005 | Sakata et al. | |
| 2010/0231269 A1 | | 9/2010 | Nakatake et al. | |
| 2014/0140102 A1 | * | 5/2014 | Duan | ...................... H02M 1/38 |
| | | | | 363/16 |

FOREIGN PATENT DOCUMENTS

| | | |
|---|---|---|
| JP | 4531500 B2 | 8/2010 |
| JP | 2015053749 A | 3/2015 |
| WO | 2007116900 A1 | 10/2007 |
| WO | 2014128951 A1 | 8/2014 |
| WO | 2015114788 A1 | 8/2015 |

\* cited by examiner

*Primary Examiner* — Jeffrey A Gblende

(57) ABSTRACT

A first aspect of the present invention will provide a short circuit detector, including: a voltage detection circuit to detect gate voltage which is input from a gate driving circuit to the semiconductor element; and a short circuit detection circuit to detect a short circuit state of the semiconductor element, when gate voltage of the semiconductor element becomes higher than or equal to first reference voltage in a transition period from when a turn-on signal is input to the gate driving circuit until when a mirror period of the semiconductor element starts.

18 Claims, 6 Drawing Sheets

SHORT CIRCUIT DETECTOR INCLUDING A VOLTAGE DETECTOR

The contents of the following Japanese patent application are incorporated herein by reference:
NO. 2017-094632 filed in JP on May 11, 2017.

BACKGROUND

1. Technical Field

The present invention relates to a short circuit detector and an apparatus.

2. Related Art

Conventionally, for an apparatus to drive each gate of two semiconductor elements connected in series between power supply lines, various techniques have been proposed to detect a short circuit between power supply lines (refer to the patent document 1, for example).
Patent Document 1: Japanese Patent Application Publication No. 2015-53749.

Time period of a short circuit state due to abnormalities is desired to be reduced as short as possible. In a detection method according to the patent document 1, semiconductor elements are sometimes broken because a short circuit state is detected after the end of a mirror period. In addition, considering a semiconductor element having small short-circuit withstanding capacity such as a wide bandgap semiconductor element is also going to be used in future, a short circuit state is desired to be detected earlier.

SUMMARY

A first aspect of the present invention may provide a short circuit detector. The short circuit detector may include a voltage detection circuit to detect gate voltage which is input from a gate driving circuit to a semiconductor element. The short circuit detector may include a short circuit detection circuit to detect a short circuit state of the semiconductor element, when gate voltage of the semiconductor element becomes higher than or equal to first reference voltage in a transition period from when a turn-on signal is input to the gate driving circuit until when a mirror period of the semiconductor element starts.

The first reference voltage may be lower than mirror voltage. The short circuit detection circuit may detect a short circuit state of the semiconductor element, when gate voltage of the semiconductor element becomes higher than or equal to second reference voltage after the transition period.

The second reference voltage may be higher than or equal to the mirror voltage. The short circuit detection circuit may detect the short circuit state of the semiconductor element, when gate voltage of the semiconductor element becomes higher than or equal to the second reference voltage over the entire ON period.

The second reference voltage may be higher than forward bias voltage of the semiconductor element. The transition period may be a period from when gate voltage of the semiconductor element becomes higher than or equal to gate threshold voltage until when the mirror period starts.

The short circuit detector may include a timing specifying unit to specify, as the transition period, a period from when a turn-on signal input to the semiconductor element and a predetermined first period elapses until when a predetermined second period elapses.

A second aspect of the present invention may provide an apparatus. The apparatus may include semiconductor elements connected in series between a positive side power supply line and a negative side power supply line. The apparatus may include the short circuit detector of the first aspect.

The apparatus may further include a gate driving circuit to drive a gate of the semiconductor element. The apparatus may further a cut-off circuit to cut off current flowing between the positive side power supply line and the negative side power supply line, in response to that a short circuit state is detected by the short circuit detector.

The apparatus may further include a series connection circuit where the semiconductor element and another semiconductor element are connected in series between the positive side power supply line and the negative side power supply line.

The apparatus may further include another short circuit detector. The short circuit detector may detect a short circuit state, in response to that the semiconductor element is turned on while the other semiconductor element is in an ON state or during a transition period of the other semiconductor element from the ON state to an OFF state. The other short circuit detector may detect a short circuit state, in response to that the other semiconductor element is turned on while the semiconductor element is in the ON state or during the transition period of the other semiconductor element from the ON state to the OFF state. The semiconductor element may be a wide bandgap semiconductor element.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
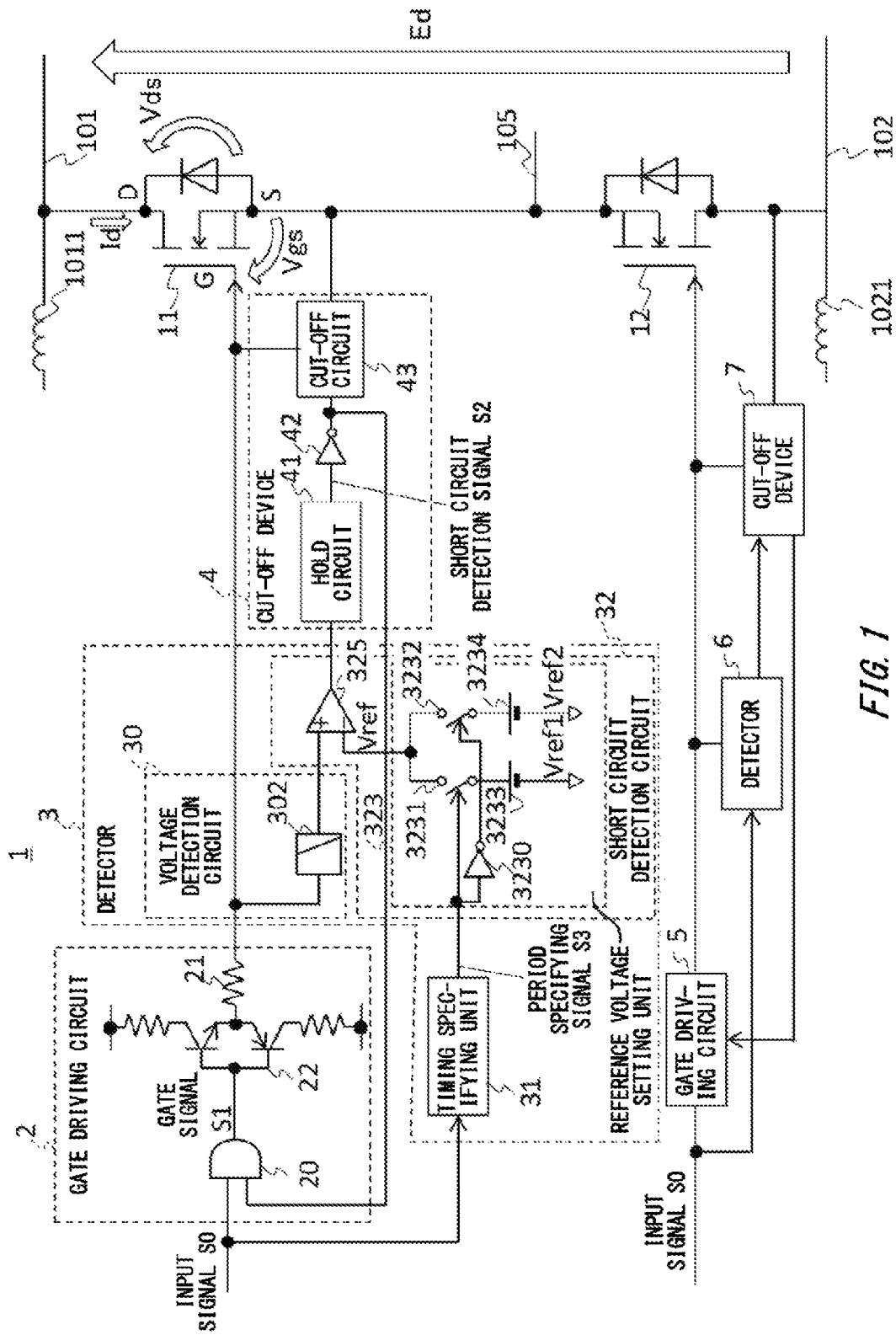
FIG. 1 shows an apparatus according to the present embodiment.

FIG. 1 shows an apparatus 1 according to the present embodiment. Note that outline arrows represent voltage or current.

The apparatus 1 is a portion as one arm of a power conversion apparatus used for driving a motor or supplying power, as one example, and outputs AC voltage from a power supply output terminal 105 by switching connection between a positive side power supply line 101, a negative side power supply line 102, and a power supply output terminal 105.

Here, between the positive side power supply line 101 and the negative side power supply line 102, DC voltage Ed of 600 to 800 V for example is applied. Also, the positive side power supply line 101 and the negative side power supply line 102, depending on their wiring lengths, have wiring inductances 1011, 1021, respectively.

The apparatus 1 includes: a positive side semiconductor element 11 and a negative side semiconductor element 12; a gate driving circuit 2, a detector 3 and a cut-off device 4 associated with the positive side semiconductor element 11; and a gate driving circuit 5, a detector 6 and a cut-off device 7 associated with the negative side semiconductor element 12. Note that, since configurations of each of the gate driving circuit 5, the detector 6 and the cut-off device 7 on the negative side each are similar to those of each of the gate driving circuit 2, the detector 3 and the cut-off device 4 on the positive side, the description will not be repeated.

The first semiconductor element 11 and the second semiconductor element 12 are connected sequentially in series between the positive side power supply line 101 and the negative side power supply line 102. The power supply output terminal 105 is connected at the midpoint of the first semiconductor element 11 and the second semiconductor element 12.

The first semiconductor element 11 and the second semiconductor element 12 are switching elements which are switched on and off by the gate driving circuit 2 described later. As one example, the first semiconductor element 11 and the second semiconductor element 12 may be a lower arm and an upper arm of the power conversion apparatus.

At least one of the first semiconductor element 11 and the second semiconductor element 12 may be a wide bandgap semiconductor element. The wide bandgap semiconductor element is a semiconductor element that has a greater bandgap than that of a silicon semiconductor element, for example, a semiconductor element including SiC, GaN, diamond, gallium nitride-based material, gallium oxide-based material, AlN, AlGaN, ZnO, or the like. The wide bandgap semiconductor element can improve the switching speed more than the silicon semiconductor element.

Also, in the present embodiment, the first semiconductor element 11 and the second semiconductor element 12 are MOSFETs having a parasitic diode with its cathode on the positive side power supply line 101 side. Note that the first semiconductor element 11 and the second semiconductor element 12 may also be other types of semiconductor elements such as an IGBT or a bipolar transistor.

The gate driving circuit 2 drives a gate of the first semiconductor element 11 based on a turn-on signal and a turn-off signal included in an input signal S0. For example, when turning the first semiconductor element 11 and the second semiconductor element 12 to an ON state alternately, the gate driving circuit 2 turns on the semiconductor element 11 after turning off the second semiconductor element 12 to be switched to the OFF state. Note that, in the present embodiment, as one example, when turning the semiconductor element 11 to the ON state, the input signal S0 is made high, whereas when turning it to the OFF state, the input signal S0 is made low.

The gate driving circuit 2 may have an AND circuit 20 and a totem-pole circuit 22.

The AND circuit 20 corrects an input signal S0 by performing a logical AND operation between the input signal S0 to the gate driving circuit 2 and a signal from the cut-off device 4 described later, and outputs it as a gate signal S1 to the gate of the first semiconductor element 11. For example, the AND circuit 20 outputs a high signal (ON signal) as the gate signal S1 when both of them are high, whereas it outputs a low signal (OFF signal) as the gate signal S1 when at least one of them is low. The AND circuit 20 supplies the gate signal S1 to the totem-pole circuit 22.

The totem-pole circuit 22 may amplify the gate signal S1 from the AND circuit 20. The totem-pole circuit 22 supplies the gate signal S1 to the first semiconductor element 11 via a gate resistance 21.

Note that, in the gate driving circuit 2 described above, the gate resistance 21 may be provided, not between the totem-pole circuit 22 and the detector 3, but between the AND circuit 20 and the totem-pole circuit 22.

The detector 3 detects a short circuit state of the semiconductor element 11. For example, the detector 3 detects a short circuit state, in response to that the semiconductor element 11 is turned on when the semiconductor element 12 is in the ON state. Also, the detector 3 detects a short circuit state, in response to that the semiconductor element 12 is turned on when the semiconductor element 11 is in the ON state. The short circuit state of the semiconductor element 11 may be a short circuit state between the positive side power supply line 101 and the negative side power supply line 102, as one example. The detector 3 includes a voltage detection circuit 30, a timing specifying unit 31 and a short circuit detection circuit 32.

The voltage detection circuit 30 detects gate voltage which is input from the gate driving circuit 2 to the semiconductor element 11. For example, the voltage detection circuit 30 may be connected to an output terminal of the gate driving circuit 2 and detect gate voltage. The voltage detection circuit 30 may supply the detected gate voltage to a later-described comparator 325 in the short circuit detection circuit 32. Note that, in the present embodiment, as one example, the voltage detection circuit 30 may have a low-pass filter 302. The low-pass filter 302 cuts the high-frequency components of gate voltage of the semiconductor element 11 (in the present embodiment, voltage at a wiring between the gate driving circuit 2 and the semiconductor element 11, as one example).

The timing specifying unit 31 specifies, as a first detection period, at least a part of a transition period from when a turn-on signal is input to the semiconductor element 11 until when the semiconductor element 11 is switched from OFF to ON. For example, the timing specifying unit 31 may specify, as the first detection period, a period where gate voltage is higher than or equal to gate voltage threshold unique to the semiconductor element 11 and until it becomes near a voltage value of the mirror period. The timing specifying unit 31 may supply a period specifying signal S3 representing whether the current timing is within the first detection period or not, to a reference voltage setting unit 323 in the short circuit detection circuit 32 described later. For example, the timing specifying unit 31 may continuously supply a high signal to the reference voltage setting unit 323 during the first detection period.

Note that, in the present embodiment, a period except the first detection period is regarded as a second detection period. However, the timing specifying unit 31 may specify at least a part of a period after the transition period as the second detection period.

The short circuit detection circuit 32 detects a short circuit state of the semiconductor element 11, in response to that gate voltage of the semiconductor element 11 becomes higher than or equal to a reference voltage during a detection period. For example, the short circuit detection circuit 32 may detect a short circuit state in response to that gate voltage becomes first reference voltage Vref1 during the first detection period, and may detect a short circuit state in response to that gate voltage becomes higher than or equal to second reference voltage Vref2 during the second detection period. The first reference voltage Vref1 and the second reference voltage Vref2 may be different from each other.

The short circuit detection circuit 32 may have the reference voltage setting unit 323 and the comparator 325.

The reference voltage setting unit 323 selects any one of the first reference voltage Vref1 and the second reference voltage Vref2, in response to the period specifying signal S3 from the timing specifying unit 31, and supplies it to the comparator 325. The reference voltage setting unit 323 may have two switches 3231, 3232 and two reference voltage sources 3233, 3234.

The switches 3231, 3232 are set ON or OFF, in response to the specification result of the first detection period by the timing specifying unit 31. For example, the switch 3231 and the switch 3232 may be alternatively set ON. In the present embodiment, as one example, the switch 3231 may be set such that a signal from the timing specifying unit 31 to the switch 3231 is supplied as it is and the switch 3231 gets closed during the first detection period. Also, the switch 3232 may be set such that a signal from the timing specifying unit 31 to the switch 3232 is supplied via a NOT circuit 3230 and the switch 3232 gets closed during the second detection period.

The switch 3231 may be connected between the reference voltage source 3233 and the comparator 325 described later. The switch 3232 may be connected between the reference voltage source 3234 and the comparator 325 described later. The reference voltage sources 3233, 3234 are connected between the switches 3231, 3232 and the ground respectively, and supply the first reference voltage Vref1 and the second reference voltage Vref2 to the comparator 325 respectively.

The comparator 325 detects a short circuit state by determining whether the reference voltage is higher than gate voltage or not. For example, when the reference voltage setting unit 323 sets the switch 3231 ON, the comparator 325 may determine whether the first reference voltage Vref1 is higher than gate voltage or not. Also, when the reference voltage setting unit 323 sets the switch 3232 ON, the comparator 325 may determine whether the second reference voltage Vref2 is higher than gate voltage or not. In the present embodiment, as one example, when the gate voltage is higher than the reference voltage, the comparator 325 may detect a short circuit state and output a high signal. Also, when gate voltage is lower than or equal to the reference voltage, the comparator 325 may output a low signal without detecting a short circuit state. The comparator 325 may supply a determination result, that is, a signal indicating the detection result of a short circuit state to the cut-off device 4.

The cut-off device 4 cuts off current flowing through the semiconductor element 11 when a short circuit state is detected. The cut-off device 4 has a hold circuit 41, a NOT circuit 42 and a cut-off circuit 43.

The hold circuit 41 holds an output signal from the comparator 325 and outputs that as a short circuit detection signal S2. For example, the hold circuit 41 may be a peak hold circuit, and when a high signal is output from the comparator 325, the hold circuit 41 may hold this and output a high signal. The hold circuit 41 may supply the short circuit detection signal S2 to the NOT circuit.

The NOT circuit 42 inverts high signals and low signals to output them. For example, when a short circuit state is detect by the detector 3 and a high signal is output as the short circuit detection signal S2, the NOT circuit 42 inverts a high signal to a low signal. Also, when a short circuit state is not detected by the detector 3 and a low signal is output as the short circuit detection signal S2, the NOT circuit 42 may invert a low signal to a high signal.

The NOT circuit 42 may supply the inverted short circuit detection signal S2 to the cut-off circuit 43 and the AND circuit 20 in the above-described gate driving circuit 2. Note that, by the inverted short circuit detection signal S2 being supplied to the AND circuit 20, a high signal (ON signal) which is input to the gate driving circuit 2 when a short circuit state is detected is corrected to a low signal (OFF signal) by the AND circuit 20 and supplied to the gate. On the other hand, when a short circuit state is not detected, the input signal S0 to the gate driving circuit 2 is supplied as it is from the AND circuit 20 to the gate.

The cut-off circuit 43 cuts off current flowing between the positive side power supply line 101 and the negative side power supply line 102, in response to that a short circuit state is detected by the short circuit detection circuit 32. In the present embodiment, as one example, in response to that a short circuit occurs between the positive side power supply line 101 and the negative side power supply line 102 and a low signal is supplied from the NOT circuit 42, the cut-off circuit 43 makes a short circuit occur between the gate and the source of the semiconductor element 11 to turn off the semiconductor element 11.

Note that, in the apparatus 1 described above, the detectors 3, 6 and/or the cut-off devices 4, 7 may be connected to a substrate on which the semiconductor elements 11, 12 are provided. Also, the apparatus 1 as a whole may be housed in one package.

According to the apparatus 1 described above, during the transition period, a short circuit state is detected in response to that gate voltage of the semiconductor element 11 becomes higher than or equal to the first reference voltage Vref1, whereas, during the second detection period except the transition period, a short circuit state is detected in response to that gate voltage becomes higher than or equal to the second reference voltage Vref2. Thus, not only a short circuit state during the transition period but also a short circuit state after the transition period can be detected. For example, the following short circuit states can be detected separately: a short circuit state generated due to a failure etc. of the semiconductor element 12, at the same time of turn-on of the semiconductor element 11; and a short circuit state generated due to an erroneous control etc. of the semiconductor element 12 while the semiconductor element 11 is in the steady ON state. Thus, regardless of generation timing of short circuit states, the short circuit states can be detected earlier.

Also, in response to detection of a short circuit state, current flowing between the positive side power supply line 101 and the negative side power supply line 102 is cut off, therefore breakage of elements due to large current can be prevented.

Figure 2:
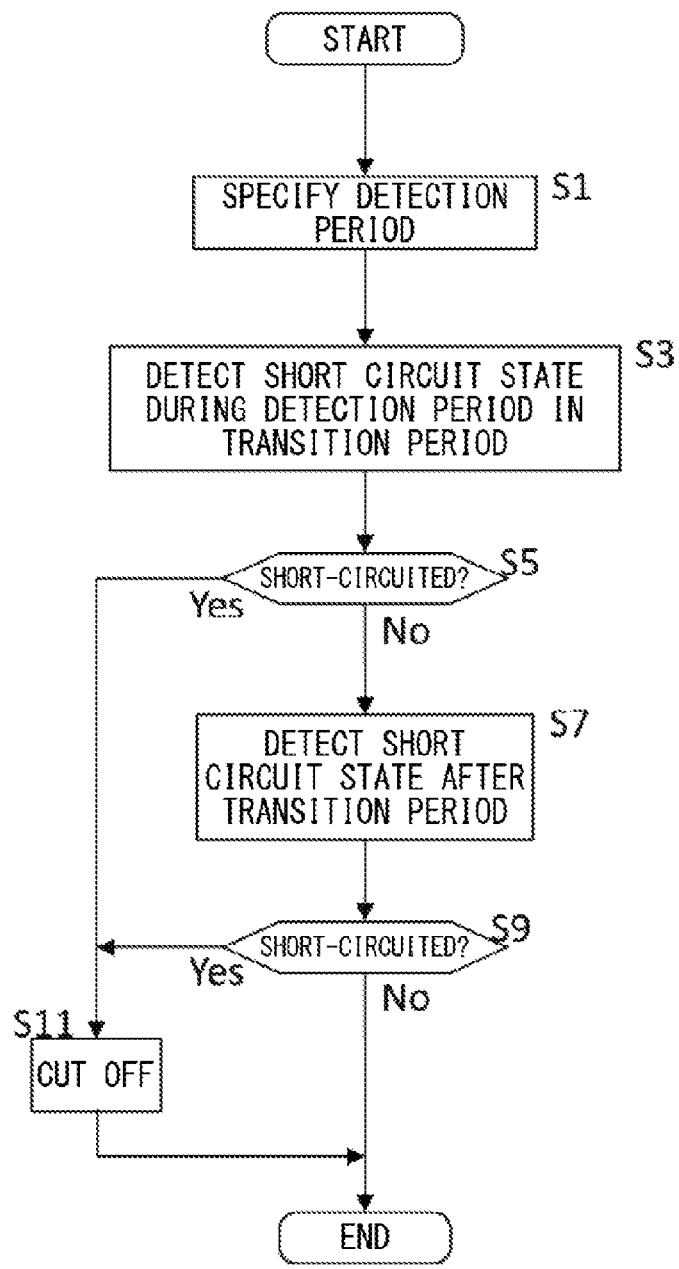
FIG. 2 illustrates an operation of the apparatus.

FIG. 2 illustrates an operation of the apparatus 1. Note that this operation starts by a turn-on signal to the semiconductor element 11 being input to the apparatus 1.

First, the timing specifying unit 31 specifies, as the first detection period, at least a part of a transition period from when a turn-on signal is input to the semiconductor element 11 until when the semiconductor element 11 is switched to ON (step S1). For example, the timing specifying unit 31 may specify, as the first detection period, a period from when a turn-on signal is input to the semiconductor element 11 until when a predetermined second period elapses. Also, the timing specifying unit 31 may specify, as the first detection period, a period from when a turn-on signal is input to the semiconductor element 11 and a predetermined first period elapses until when the predetermined second period elapses. In the present embodiment, as one example, the timing specifying unit 31 specifies, as the first detection period, at least a part of a transition period from when a turn-on signal is input until when the mirror period starts. Here, the mirror period is a period where gate voltage is clamped, due to a mirror effect, at a constant value (mirror voltage, gate plateau voltage, gate clamp voltage). The beginning of the transition period may be after the timing when drain-source voltage of the semiconductor element 11 starts decreasing.

Note that a timing when the semiconductor element 11 is switched to ON, that is, the end of the transition period may be, for example, a timing after gate voltage exceeds gate threshold voltage and the semiconductor element 11 starts being turned on. As one example, the end of the transition period may be a timing when the parasitic diode of the semiconductor element 12 starts shifting to the OFF state due to current flowing between the drain and the source of the semiconductor element 11, that is, a start timing of the mirror period. Also, the end of the transition period may be a timing when the parasitic diode of the semiconductor element 12 is completely switched to the OFF state, that is, an end timing of the mirror period. Also, the end of the transition period may be a timing when gate-source voltage of the semiconductor element 11 becomes forward bias voltage. The forward bias voltage may be gate-source voltage which is determined according to maximum current allowed to flow in the semiconductor element 11. Or, it may be determined according to maximum voltage allowed for the gate.

Then, the detector 3 detects in a short circuit state of the semiconductor element 11 during the first detection period in the transition period (step S3), and determines whether a short circuit state has been detected or not (step S5). For example, the detector 3 may detect a short circuit state, in response to that gate voltage of the semiconductor element 11 becomes higher than or equal to the first reference voltage Vref1 during the first detection period.

When it is determined, in step S5, that a short circuit state is detected (step S5; Yes), the cut-off device 4 cuts off current flowing in the semiconductor element 11 (step S11). For example, the cut-off device 4 may turn off the semiconductor element 11 by making a short circuit occur between the gate and the source of the semiconductor element 11 to lower gate potential, or may turn off the semiconductor element 11 by correcting an input signal S0 to the gate driving circuit 2 into a low signal (OFF signal). Then, when step S11 ends, the apparatus 1 ends the operation.

Also, when it is determined, in step S5, that a short circuit state is not detected (step S5; No), the detector 3 detects a short circuit state of the semiconductor element 11 during the second detection period after the transition period (step S7), and determines whether a short circuit state has been detected or not (step S9). For example, the detector 3 may detect a short circuit state, in response to that gate voltage of the semiconductor element 11 becomes higher than or equal to the second reference voltage Vref2.

When it is determined, in step S9, that a short circuit state is detected (step S9; Yes), the apparatus 1 shifts the process to step S11 described above.

Also, when it is determined, in step S9, that a short circuit state is not detected (step S9; No), the apparatus 1 ends the operation.

According to the operation described above, a short circuit state of the semiconductor element 11 is detected, in response to that gate voltage of the semiconductor element 11 becomes higher than or equal to the first reference voltage Vref1 during a transition period from when a turn-on signal is input to the semiconductor element 11 until when the mirror period starts. Thus, since a short circuit state can be detected before the mirror period, the detection timing can be made earlier, as compared with the case where a short circuit state is detected after the mirror period.

Figure 3:
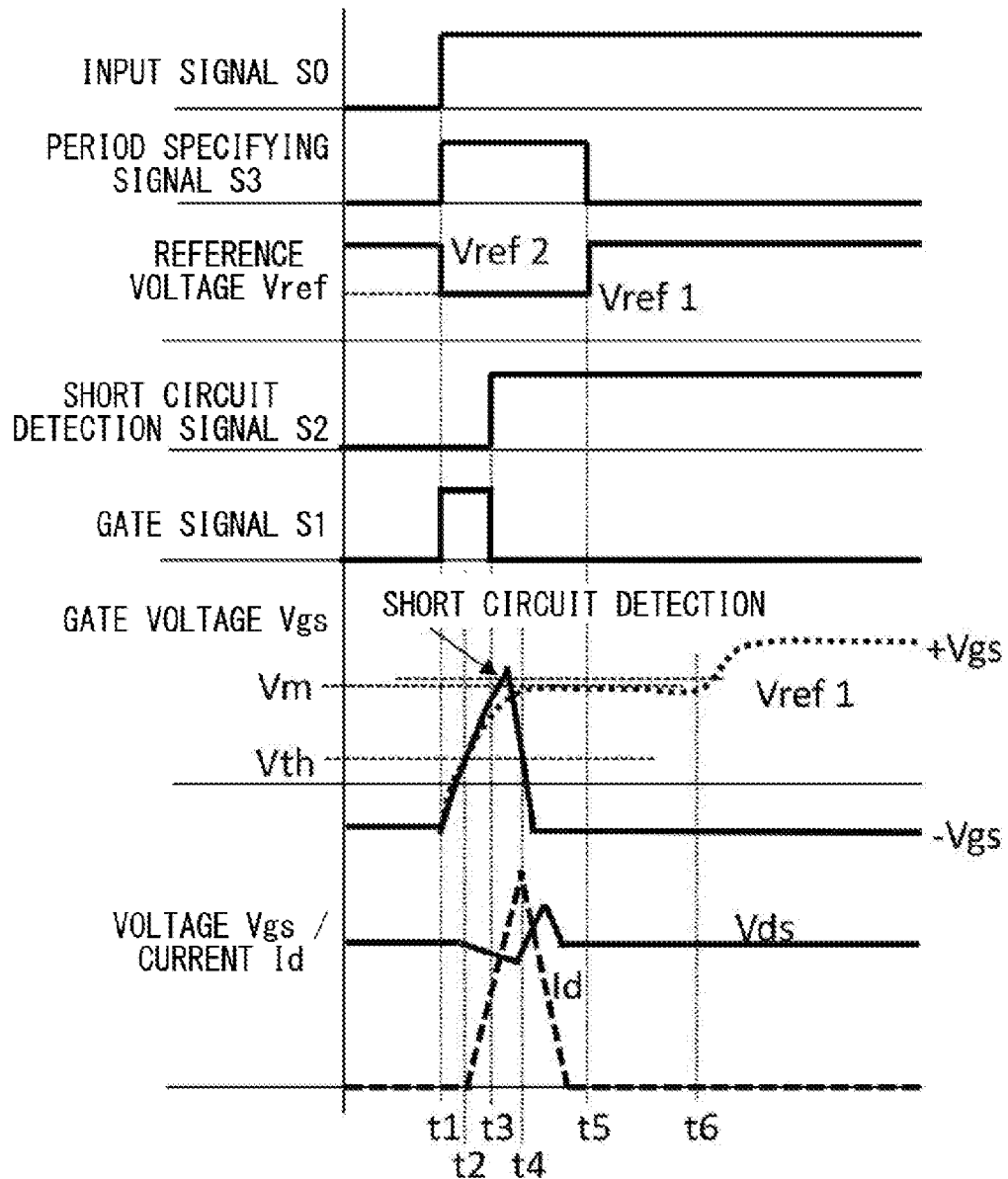
FIG. 3 shows an exemplary operation waveform of the apparatus.

FIG. 3 shows an exemplary operation waveform of the apparatus 1. The apparatus 1 detects, according to an operation waveform in FIG. 3, a short circuit generated at the time of turning on the semiconductor element 11 due to failure etc. of the semiconductor element 12 and cuts off current. Note that, in the figure, a solid-lined waveform in "gate voltage" represents a waveform when a short circuit has occurred between the positive side power supply line 101 and the negative side power supply line 102, whereas a broken-lined waveform represents a waveform when a short circuit has not occurred.

First, an input signal S0, which becomes high from time t1, is input to the apparatus 1 (refer to the waveform of the input signal S0). The input signal S0 is supplied to the AND circuit 20 and the timing specifying unit 31.

When the input signal S0 is supplied, the AND circuit 20 supplies the gate signal S1 to the gate of the semiconductor element 11. Here, a short circuit is not detected when the input signal S0 is input, and a high signal is being supplied from the cut-off device 4 to the AND circuit 20. Thus, the AND circuit 20 supplies the input signal S0 as it is, as the gate signal S1, to the gate of the semiconductor element 11 (refer to the waveform of the gate signal S1). Thereby, the gate voltage Vgs of the semiconductor element 11 increases and exceeds gate threshold Vth at time t2 (5 v, as one example), and the semiconductor element 11 starts being turned on (refer to the waveform of the gate voltage).

On the other hand, when a turn-on signal is supplied as the input signal S0, the timing specifying unit 31 specifies the first detection period in the transition period. Here, in the present embodiment, as one example, when the semiconductor element 11 is turned ON, according to the input signal S0, without a short circuit occurring between the positive side power supply line 101 and the negative side power supply line 102, gate voltage Vgs is clamped at the mirror voltage Vm during a period from time t4 to time t6 (refer to the broken-lined waveform of the gate voltage). Thus, in the present embodiment, as one example, the timing specifying unit 31 specifies a period from time t1 to time t5, which is before the end of the mirror period, as the first detection period during the transition period (a period from time t1 to time t6, for example). Then, the timing specifying unit 31 supplies, to the reference voltage setting unit 323, the period specifying signal S3, which becomes high during the first detection period from time t1 to time t5 (refer to the waveform of the period specifying signal S3).

Then, the reference voltage setting unit 323 supplies, to the comparator 325, the first reference voltage Vref1 during the first detection period from time t1 to time t5 based on the period specifying signal S3 (refer to the waveform of the reference voltage). Here, the first reference voltage Vref1 may be lower than or equal to forward bias voltage +Vgs (15 to 18 v, as one example), (refer to the waveform of the gate voltage). For example, the first reference voltage Vref1 may be voltage higher than gate voltage during the first detection period when the semiconductor element 11 is turned on without generation of a short circuit, and may be lower than gate voltage during the first detection period when the semiconductor element 11 is turned on with generation of a short circuit.

Then, the comparator 325 detects a short circuit state by comparing gate voltage Vgs with the first reference voltage Vref1 during the first detection period, and the hold circuit 41 holds the detection result and outputs it as the short circuit detection signal S2. In the present embodiment, as one example, since gate voltage Vgs exceeds the first reference voltage Vref1 at time t3 by the semiconductor element 12 turned to the ON state due to a failure, therefore a short circuit state is detected, the short circuit detection signal S2 becomes high from time t3 (refer to the waveform of the short circuit detection signal S2).

Then, the cut-off device 4 cuts off current flowing between the positive side power supply line 101 and the negative side power supply line 102, in response to that a short circuit state is detected. For example, the NOT circuit 42 turns off the semiconductor element 11 by supplying an inverted signal of the short circuit detection signal S2 to the AND circuit 20 and turning low the gate signal S1 from the AND circuit 20 to the gate from time t3 (refer to the waveform of the gate signal S1).

Figure 4:
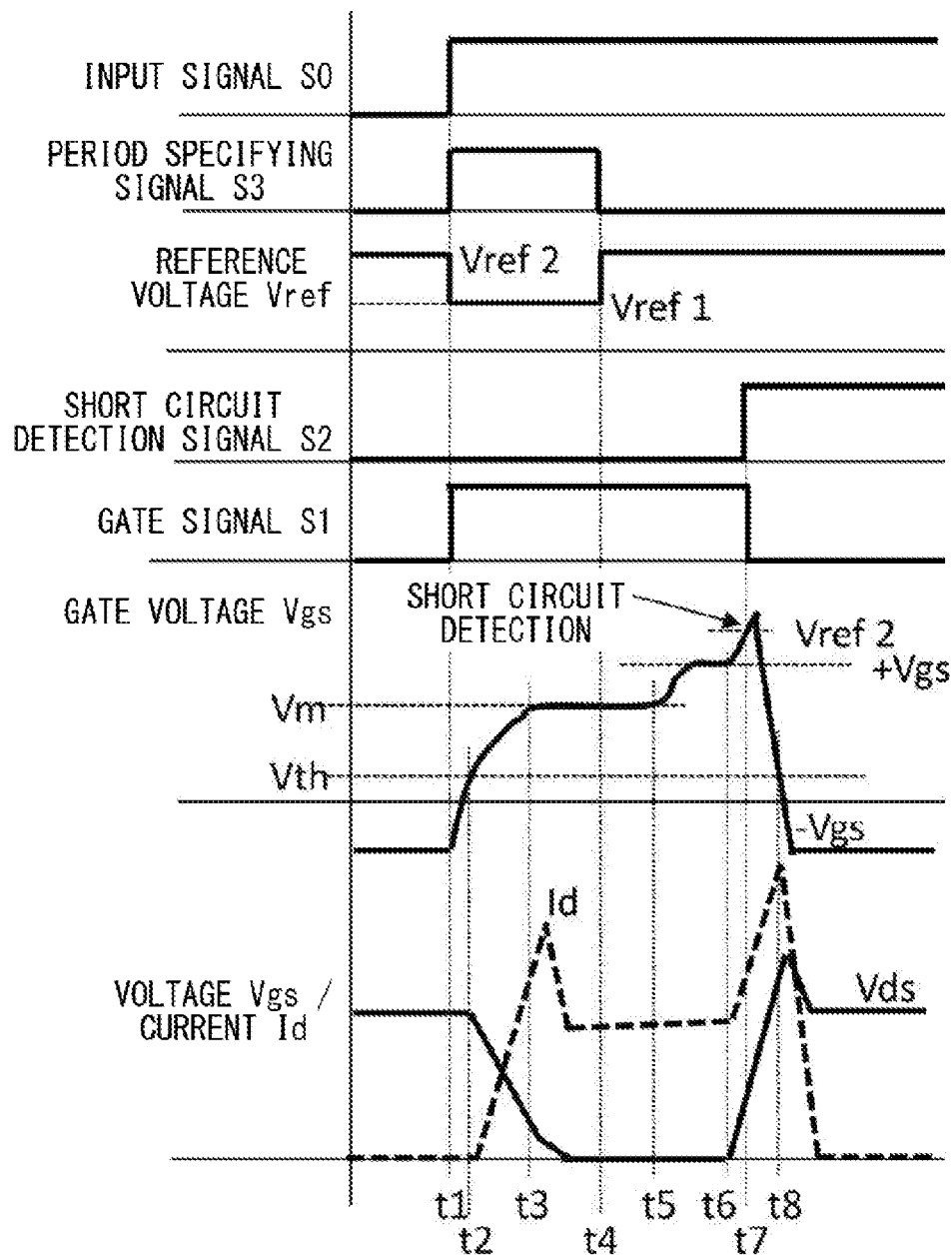
FIG. 4 shows another exemplary operation waveform of the apparatus.

FIG. 4 shows another exemplary operation waveform of the apparatus 1. The apparatus 1, according to an operation waveform in FIG. 4, detects a short circuit which is generated by an erroneous control etc. of the semiconductor element 12 during the steady ON state of the semiconductor element 11, and cuts off current. Note that, for waveforms, operations similar to those in FIG. 3, the description will not be repeated.

First, since a short circuit state is not detected during the first detection period from time t1 to time t4, the reference voltage setting unit 323 supplies, to the comparator 325, the second reference voltage Vref2 during the second detection period after the first detection period (refer to the waveform of the reference voltage). Here, the second reference voltage Vref2 may be higher than the first reference voltage Vref1, or higher than the forward bias voltage +Vgs (refer to the waveform of gate voltage). The second reference voltage Vref2 may be higher than or equal to the mirror voltage.

Then, the comparator 325 detects a short circuit state by comparing gate voltage Vgs with the second reference voltage Vref2 during the second detection period, and the hold circuit 41 holds the detection result and outputs it as the short circuit detection signal S2. In the present embodiment, as one example, after gate voltage Vgs exceeds the forward bias voltage +Vgs at time t6 due to the semiconductor element 12 being erroneously turned on, gate voltage Vgs exceeds the second reference voltage Vref2 at time t7 and a short circuit state is detected (refer to the waveform of the gate voltage). Thus, the short circuit detection signal S2 becomes high from time t7 (refer to the waveform of the short circuit detection signal S2). Note that the increase of gate voltage Vgs may occur because charge current via a feedback capacitance Cgd flows to the gate side as drain-source voltage Vds of the semiconductor element 11 increasing due to a short circuit.

Then, the cut-off device 4 cuts off current flowing between the positive side power supply line 101 and the negative side power supply line 102, in response to that a short circuit state is detected. For example, the NOT circuit 42 may turn off the semiconductor element 11 by supplying an inverted signal of the short circuit detection signal S2 to the AND circuit 20 and turning low the gate signal S1 from the AND circuit 20 to the gate from time t7 (refer to the waveform of the gate signal S1).

Figure 5:
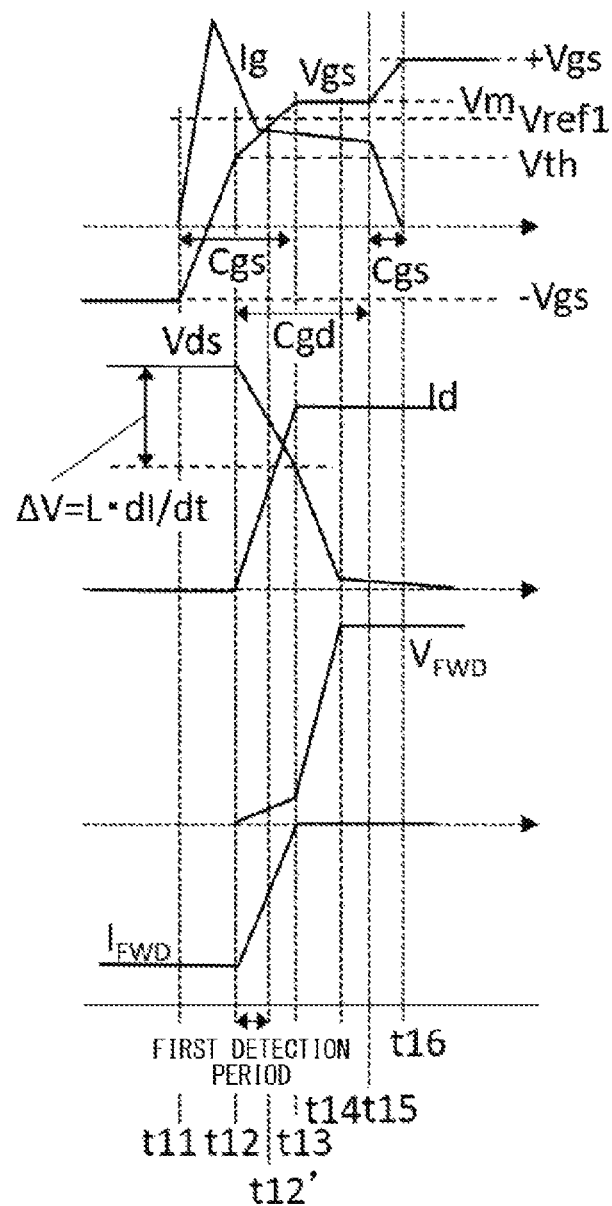
FIG. 5 shows another exemplary operation waveform of the apparatus during a first detection period.

FIG. 5 shows another exemplary operation waveform of the apparatus 1 during a first detection period. In this exemplary operation, the semiconductor element 12 is not turned in the ON state, thus a short circuit due to turn-on of the semiconductor element 11 is not generated. Note that, in FIG. 5, the input signal S0, the short circuit detection signal S2, the gate signal S1, and the like are not repeatedly shown. Also, in FIG. 5, a period shown by Cgs and Cgd represents charge periods of capacitances Cgs, Cgd. Also, $I_{FWD}$ and $V_{FWD}$ represent a current value and a voltage value at the parasitic diode of the semiconductor element 11.

First, by the input signal S0 being supplied to the gate to turn ON the semiconductor element 11, gate voltage Vgs of the semiconductor element 11 starts increasing from time t11 and charges the gate-source capacitance Cgs. With this, gate current Ig increases. Also, a gate-drain capacitance Cgd gets charged. Note that, since the semiconductor element 11 is not ON until time t12 described later, the drain-source voltage Vds, the drain current Id and the current $I_{FWD}$ of the parasitic diode may remain constant values.

Then, when gate-source voltage Vgs becomes the gate threshold voltage Vth at time t12, the semiconductor element 11 starts being turned ON, and decrease of the drain-source voltage Vds, increase of the drain current Id, and increase of the parasitic diode current $I_{FWD}$ in the negative region start. Note that, during a period from time t12 until time t13 described later, charging the gate-source capacitance Cgs and the gate-drain capacitance Cgd may be performed at the same time. Also, due to an internal inductance of the wiring inductance 1011 and the semiconductor element 11, drain-source voltage Vds may decrease by $\Delta V = L \cdot dI/dt$. Also, voltage $V_{FWD}$ on both ends of the parasitic diode may become higher than or equal to zero.

Then, the gate-source voltage Vgs becomes the mirror voltage Vm (12 v, as one example) at time t13, and the mirror period starts, where the mirror effect of Cin=Cgs+(1+Av)·Cgd is produced, where Cin is an input capacitance and Av is an amplification factor. Also, the current $I_{FWD}$ becomes zero from time t13, the parasitic diode starts being turned to the OFF state. With this, the drain current Id gets saturated to be maintained at a constant value, the drain-source voltage Vds steeply decreases, and the voltage $V_{FWD}$ on the both ends of the parasitic diode steeply increases. The gate-source voltage Vgs is maintained at the mirror voltage.

Then, at time t14, the parasitic diode is completely turned in the OFF state completely. Also, at time t15, the mirror period ends. With this, during a period time t15 to time t16, the capacitance Cgs gets charged until the gate-source voltage Vgs becomes the forward bias voltage. Then, after time t16, the gate-source voltage Vgs is maintained at the forward bias voltage +Vgs and the ON state continues. Note that, a length of the period from time t12, when gate voltage Vgs becomes the gate threshold voltage Vth (5 v, as one example), until time t16, when gate voltage Vgs becomes the forward bias voltage (15 to 18 v, as one example), may be several hundreds ns.

Note that, in the operation described above, in response to that a turn-on signal is supplied as the input signal S0, a period until the mirror period starts (time t12 to time t12', as one example) may be specified as the first detection period. Also, the first reference voltage Vref1 may be lower than the mirror voltage Vm. However, in this exemplary operation, since the semiconductor element 12 is not turned in the ON state, a short circuit is not detected and the semiconductor element 11 gets turned in the ON state.

Figure 6:
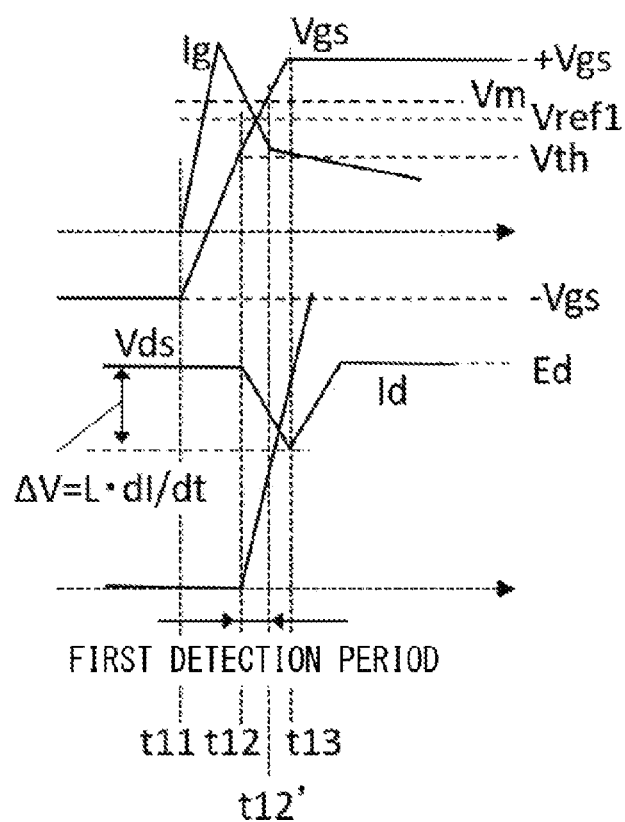
FIG. 6 shows still another exemplary operation waveform of the apparatus during the first detection period.

FIG. 6 shows still another exemplary operation waveform of the apparatus 1 during the first detection period. In this exemplary operation, the semiconductor element 12 is turned to the ON state due to a failure etc., and thus a short circuit is generated due to turn-on of the semiconductor element 11. Note that, for waveforms, operations similar to those in FIG. 5, the description will not be repeated.

First, when gate-source voltage Vgs becomes the gate threshold voltage Vth at time t12, semiconductor element 11 starts being turned ON, and decrease of the drain-source voltage Vds and increase of the drain current Id start. Also, due to an internal inductance of the wiring inductance 1011 and the semiconductor element 11, drain-source voltage Vds decreases by $\Delta V = L \cdot dI/dt$. However, in the present exemplary operation, since the semiconductor element 12 is turned in the ON state, the drain current Id does get saturated and continues increasing, the drain-source voltage Vds increases again from time t13, and becomes the DC voltage Ed between the positive side power supply line 101 and the negative side power supply line 102, and then the semiconductor element 11 becomes in a short circuit state. Also, the gate-source voltage Vgs increases exceeding the mirror voltage, and becomes the forward bias voltage +Vgs at time t13.

Here, when the semiconductor element 11 is in a short circuit state, for example, when between the positive side power supply line 101 and the negative side power supply line 102 becomes in a short circuit state, the parasitic diode of the semiconductor element 11 is not made turned OFF. Thereby, since no voltage is generated during turning off the parasitic diode, as compared with the case shown in FIG. 5, the drain-source voltage Vds is higher during a period from time t12 to time t13. Thus, the gate-drain capacitance Cgd does not get charged enough, and the mirror effect of Cin=Cgs+(1+Av)·Cgd is not produced, and the gate-source capacitance Cgs is charged with Cin≈Cgs being as it is. Thereby, the gate-source voltage Vgs becomes higher during a period from time t12 to time t13, as compared with the case shown in FIG. 5.

Thus, in the present exemplary operation, in the first detection period (a period from time t12 to time t12' in the present embodiment, as one example), a short circuit state is detect by comparing the gate voltage Vgs with the first reference voltage Vref1 which is lower the mirror voltage Vm. As one example, at 100 ns later from time t12, when gate voltage Vgs becomes the gate threshold voltage Vth (5 v, as one example), gate voltage Vgs becomes higher than or equal to the first reference voltage Vref1 (12 v, as one example) and a short circuit state may be detected.

Note that, in the embodiment described above, it has been described that the apparatus 1 include two semiconductor elements 11, 12, but it may not include one of these, or it may include another element as an alternative to one of these. Also, in this case, the apparatus 1 may include only one of two of the gate driving circuits 2, 5, only one of two of the detectors 3, 6, and only one of two of the cut-off devices 4, 7, respectively.

Also, it has been described that the detector 3 detects a short circuit during the first detection period and the second detection period, but it may detect it only during the first detection period. In this case, the detector 3 may include an analog switch to supply gate voltage to a low-pass filter 302 only during the first detection period specified by the timing specifying unit 31.

Also, it has been described that the detector 3 detects a short circuit during the first detection period and the second detection period by switching the reference voltage input to the comparator 325 for each period, but it may detect a short circuit by other manners. For example, the detector 3 may have a first comparator, to which the first reference voltage Vref1 is always input, drive during the first detection period and detect a short circuit, and moreover, the detector 3 may have a second comparator, to which the second reference voltage is always input, drive during the second detection period and detect a short circuit. In this case, the second comparator may always be driven without being limited to the second detection period, or may be driven over the entire ON period of the semiconductor element 11. The second reference voltage may be higher than the forward bias voltage of the semiconductor element 11.

Also, it has been described that the detector 3 has the timing specifying unit 31 to specify at least a part of the transition period as the detection period, but the detector 3 may not have it. For example, the detector 3 may detect a short circuit state by the short circuit detection circuit 32, over the entire transition period or at least a part of the transition period.

Also, it has been described that the cut-off device 4 holds an output signal from the comparator 325 by the hold circuit 41, and turns off the semiconductor element 11 by making a short circuit occur between the gate and the source of the semiconductor element 11 by the cut-off circuit 43, but the cut-off device 4 may turn it off by other mechanism.

What is claimed is:

1. A short circuit detector comprising:
a voltage detection circuit to detect a gate voltage which is input from a gate driving circuit to a semiconductor element;
a short circuit detection circuit to detect a short circuit state of the semiconductor element only when during a first detection period the gate voltage of the semiconductor element becomes higher than or equal to a first reference voltage, the first detection period being at least a part of a transition period which is a period from when a turn-ON signal is input to the gate driving circuit until when a mirror period of the semiconductor element starts, or when during a second detection period the gate voltage of the semiconductor element becomes higher than or equal to a second reference voltage, the second detection period being different from the first detection period and does not overlap the first detection period, wherein
the first reference voltage is lower than a mirror voltage,
the second reference voltage is higher than the first reference voltage, and
the short circuit state is not detected when the gate voltage of the semiconductor element is higher than the first reference voltage and lower than the second reference voltage during the second detection period.

2. A short circuit detector comprising:
a voltage detection circuit to detect a gate voltage which is input from a gate driving circuit to a semiconductor element;
a short circuit detection circuit to detect a short circuit state of the semiconductor element only when during a first detection period the gate voltage of the semiconductor element becomes higher than or equal to a first reference voltage, the first detection period being at least a part of a transition period which is a period at least from when a turn-ON signal is input to the gate driving circuit until when a mirror period of the semiconductor element starts, or when during a second detection period the gate voltage of the semiconductor element becomes higher than or equal to a second reference voltage, the second detection period being different from the first detection period and does not overlap the first detection period, wherein the second reference voltage is higher than the first reference voltage, and the short circuit state is not detected when the gate voltage of the semiconductor element is higher than the first reference voltage and lower than the second reference voltage during the second detection period.

3. The short circuit detector according to claim 2, wherein the second reference voltage is higher than or equal to a mirror voltage.

4. A short circuit detector comprising:
a voltage detection circuit to detect a gate voltage which is input from a gate driving circuit to a semiconductor element; and
a short circuit detection circuit to detect a short circuit state of the semiconductor element only when during a first detection period the gate voltage of the semiconductor element becomes higher than or equal to a first reference voltage, the first detection period being during at least a part of a transition period which is a period at least from when a turn-ON signal is input to the gate driving circuit until when a mirror period of the semiconductor element starts, or when during a second detection period the gate voltage of the semiconductor element becomes higher than or equal to a second reference voltage, the second detection period being different from the first detection period and does not overlap the first detection period, wherein
the second reference voltage is higher than the first reference voltage over an entire ON period, and
the short circuit state is not detected when the gate voltage of the semiconductor element is higher than the first reference voltage and lower than the second reference voltage during the second detection period.

5. The short circuit detector according to claim 4, wherein the second reference voltage is higher than a forward bias voltage of the semiconductor element.

6. The short circuit detector according to claim 1, wherein a detection period of the short circuit state of the semiconductor element during the transition period is a period from when the gate voltage of the semiconductor element becomes higher than or equal to a gate threshold voltage until when the mirror period starts.

7. The short circuit detector according to claim 2, wherein a detection period of the short circuit state of the semiconductor element during the transition period is a period from when the gate voltage of the semiconductor element becomes higher than or equal to a gate threshold voltage until when the mirror period starts.

8. The short circuit detector according to claim 4, wherein a detection period of the short circuit state of the semiconductor element during the transition period is a period from when the gate voltage of the semiconductor element becomes higher than or equal to a gate threshold voltage until when the mirror period starts.

9. The short circuit detector according to claim 1, further comprising
a timing specifying unit to specify, as a detection period of the short circuit state of the semiconductor element during the transition period, a period from when the turn-ON signal is input to the semiconductor element and a predetermined first period elapses until when a predetermined second period elapses.

10. The short circuit detector according to claim 2, further comprising
a timing specifying unit to specify, as a detection period of the short circuit state of the semiconductor element during the transition period, a period from when the turn-ON signal is input to the semiconductor element and a predetermined first period elapses until when a predetermined second period elapses.

11. The short circuit detector according to claim 4, further comprising
a timing specifying unit to specify, as a first detection period of the short circuit state of the semiconductor element during the transition period, a period from when the turn-ON signal is input to the semiconductor element and a predetermined first period elapses until when a predetermined second period elapses.

12. An apparatus comprising:
a plurality of semiconductor elements including the semiconductor element connected in series between a positive side power supply line and a negative side power supply line; and
the short circuit detector according to claim 1.

13. An apparatus comprising:
a plurality of semiconductor elements including the semiconductor element connected in series between a positive side power supply line and a negative side power supply line; and
the short circuit detector according to claim 2.

14. An apparatus comprising:
a plurality of semiconductor elements including the semiconductor element connected in series between a positive side power supply line and a negative side power supply line; and
the short circuit detector according to claim 4.

15. The apparatus according to claim 14, further comprising
another gate driving circuit to drive a gate of at least one of the plurality of semiconductor elements.

16. The apparatus according to claim 14, further comprising
a cut-off circuit to cut off current flowing between the positive side power supply line and the negative side power supply line, in response to the short circuit state detected by the short circuit detection circuit.

17. The apparatus according to claim 14, further comprising
another short circuit detection circuit, wherein
the short circuit detection circuit detects the short circuit state, in response to the semiconductor element being turned ON while at least one of the plurality of semiconductor elements is in an ON state or during a transition period of the at least one of the plurality of semiconductor elements from an ON state to an OFF state; and
the another short circuit detection circuit detects the short circuit state, in response to the at least one of the plurality of semiconductor elements being turned ON while the semiconductor element is in an ON state or during a transition period of the at least one of the plurality of semiconductor elements from an ON state to an OFF state.

18. The apparatus according to claim 14, wherein the semiconductor element is a wide bandgap semiconductor element.

* * * * *